United States Patent
Lee et al.

(10) Patent No.: US 8,964,408 B2
(45) Date of Patent: Feb. 24, 2015

(54) ELECTROMAGNETIC INTERFERENCE ABSORBER, DISPLAY DEVICE AND ELECTRONIC DEVICE HAVING THE SAME

(75) Inventors: Sung-Kyu Lee, Suwon-Si (KR); Ju-Geun Kim, Yongin-Si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1126 days.

(21) Appl. No.: 12/247,631

(22) Filed: Oct. 8, 2008

(65) Prior Publication Data
US 2009/0109200 A1 Apr. 30, 2009

(30) Foreign Application Priority Data
Oct. 25, 2007 (KR) .................. 10-2007-0107747

(51) Int. Cl.
*H05K 9/00* (2006.01)
*G09G 5/00* (2006.01)
*G02F 1/1333* (2006.01)
*G09G 3/20* (2006.01)

(52) U.S. Cl.
CPC .... *H05K 9/002* (2013.01); *G02F 2001/133334* (2013.01); *G09G 3/20* (2013.01); *G09G 2310/0267* (2013.01); *G09G 2310/0275* (2013.01); *G09G 2330/06* (2013.01)
USPC .......... 361/818; 345/205; 174/356; 174/366; 174/369; 174/377; 720/650

(58) Field of Classification Search
USPC .......... 345/205; 174/377, 382, 356, 366, 369
See application file for complete search history.

(56) References Cited

U.S. PATENT DOCUMENTS

| | | | | |
|---|---|---|---|---|
| 4,670,347 A * | 6/1987 | Lasik et al. | ................... | 428/458 |
| 4,857,668 A * | 8/1989 | Buonanno | ..................... | 174/354 |
| 4,968,854 A * | 11/1990 | Benn et al. | .................... | 174/354 |
| 5,120,903 A * | 6/1992 | Tam | ............................... | 174/354 |
| 5,524,908 A * | 6/1996 | Reis | ............................... | 277/654 |
| 5,578,790 A * | 11/1996 | Peregrim | ..................... | 174/356 |
| 6,347,035 B1 * | 2/2002 | Hamano et al. | .......... | 361/679.54 |
| 6,869,683 B2 * | 3/2005 | Sakurai et al. | ................ | 428/448 |
| 7,135,643 B2 * | 11/2006 | van Haaster et al. | ........ | 174/382 |
| 7,410,825 B2 * | 8/2008 | Majumdar et al. | ............ | 438/106 |
| 7,468,582 B2 * | 12/2008 | Kim et al. | ..................... | 313/582 |
| 7,470,866 B2 * | 12/2008 | Dietrich et al. | ............... | 174/356 |
| 7,602,931 B2 * | 10/2009 | Akino et al. | ................... | 381/355 |
| 7,880,095 B2 * | 2/2011 | Kang et al. | ..................... | 174/356 |
| 2001/0031589 A1 * | 10/2001 | Bunyan et al. | ................ | 442/110 |
| 2002/0108767 A1 * | 8/2002 | Kim | ........................... | 174/35 R |
| 2003/0173100 A1 * | 9/2003 | Flaherty et al. | .......... | 174/35 GC |
| 2003/0223213 A1 * | 12/2003 | Daoud et al. | ................... | 361/818 |
| 2004/0020674 A1 * | 2/2004 | McFadden et al. | ...... | 174/35 MS |
| 2005/0077822 A1 | 4/2005 | Kim et al. | | |
| 2006/0040520 A1 * | 2/2006 | Moh | ........................... | 439/66 |
| 2006/0099403 A1 * | 5/2006 | Johnson | ....................... | 428/323 |

(Continued)

FOREIGN PATENT DOCUMENTS

KR 1020050034369 4/2005

*Primary Examiner* — Temesgh Ghebretinsae
*Assistant Examiner* — Benyam Ketema
(74) *Attorney, Agent, or Firm* — F. Chau & Associates, LLC

(57) ABSTRACT

An electromagnetic interference (EMI) absorber includes an EMI conductive sheet having first and second portions, the first portion absorbing EMI from an EMI absorption target and the second portion for conducting EMI to an EMI discharge target, and an elastic member covered by the first portion.

25 Claims, 8 Drawing Sheets

(56) References Cited

U.S. PATENT DOCUMENTS

2006/0103081 A1  5/2006  Dietrich et al.
2006/0146511 A1* 7/2006  Huang .......................... 361/818
2006/0151962 A1* 7/2006  Hammaker et al. .......... 277/653
2006/0272856 A1* 12/2006 Arnold ......................... 174/377
2007/0059901 A1* 3/2007  Majumdar et al. ............ 438/455
2009/0114438 A1* 5/2009  van Haaster .................. 174/356

* cited by examiner

ELECTROMAGNETIC INTERFERENCE ABSORBER, DISPLAY DEVICE AND ELECTRONIC DEVICE HAVING THE SAME

CROSS-REFERENCE TO RELATED APPLICATION

This application claims priority to Korean Patent Application No. 10-2007-0107747 filed on Oct. 25, 2007, the contents of which are incorporated by reference herein in their entirety.

BACKGROUND

1. Technical Field

The present disclosure relates to an electromagnetic interference (EMI) absorber and a display device including the EMI absorber, and more particularly, to an EMI absorber including an EMI absorption part and an EMI transmission part, a display device including the EMI absorber, and an electronic device including the EMI absorber.

2. Discussion of Related Art

EMI absorbers or conductive sheets are used to enhance ground contacts and transmit noise to an electrical ground to reduce noise.

However, in liquid crystal display (LCD) devices, since a data-side printed circuit board (PCB) for driving an LCD panel is thin or the number of layers of the data-side PCB is reduced, the ground region of the data-side PCB is limited. Therefore, in the LCD devices with the limited ground region, noise is not reduced to a desired level by attaching an EMI absorber to an electric ground.

In a conventional art, EMI absorbers provide electric contacts between ground portions of spaced targets. Conductive sheets provide electric contacts for ground portions of targets which are narrowly spaced or have no space therebetween.

Therefore, the conventional EMI absorbers are not suitable for providing electric contacts between ground portions of broadly spaced targets. When both the EMI absorber and the conductive sheet are used, the EMI absorber and the conductive sheet are individually attached in the LCD devices. This increases manufacturing processes and costs.

SUMMARY OF THE INVENTION

The present disclosure provides an electromagnetic interference (EMI) absorber reducing EMI when the area of an electrical ground is small; a display device including the EMI absorber; and an electronic device including the EMI absorber.

The present disclosure also provides an EMI absorber transmitting EMI from a ground portion of an EMI-absorption target to an EMI-discharge target when the EMI-absorption target is distant from the EMI-discharge target; a display device including the EMI absorber; and an electronic device including the EMI absorber.

The present disclosure provides an EMI absorber including an EMI absorption part and a conductive sheet that can be simultaneously attached in an LCD device; a display device including the EMI absorber; and an electronic device including the EMI absorber.

According to an exemplary embodiment of the present invention, an electromagnetic interference (EMI) absorber comprises an EMI conductive sheet having first and second portions, the first portion absorbing EMI from an EMI absorption target and the second portion for conducting EMI to an EMI discharge target, and an elastic member covered by the first portion.

The first portion and the second portion can be formed from a single sheet.

The first portion and the second portion can be formed from separate sheets and electrically coupled with each other.

The EMI absorption target may comprise a ground portion of a data-side PCB and the EMI discharge target may comprise an outer surface of a lower accommodation member of an LCD device.

The elastic member and the first portion of the EMI sheet may form a volume and the second portion can extend axially from a bottom portion of the volume.

The elastic member can have at least one of a circular shape, an elliptical shape or a polygonal shape.

The elastic member can comprise a sponge.

The sponge can be selected from a group consisting of at least one of a foamed polyurethane, a foamed silicon, a foamed neoprene, a thermo plastic elastomer, a rubber or any combinations thereof.

The conductive sheet may comprises a fabric and a metal plated on the fabric.

The fabric may comprise at least one of polyester or nylon.

The metal may comprise at least one of copper (Cu), silver (Ag), or copper (Cu)/nickel (Ni).

The conductive sheet may comprise a conductive foil.

The EMI absorber may further a support disposed between the elastic member and the first portion.

The support may comprise at least one of polyvinyl chloride (PVC) or polyethylene.

The support can have a width equal to or smaller than that of the elastic member.

The support can have at least one of a sheet shape, a fastener shape, or a clip shape.

The EMI absorber may include one or more elastic members.

The EMI absorber may further comprise a conductive adhesive member disposed on a surface of the conductive sheet.

According to an exemplary embodiment of the present invention, a display device comprises a display panel, a printed circuit board (PCB) for driving the display panel, the PCB comprising a ground portion, an accommodation member for receiving the display panel and the PCB, and an EMI absorber connecting the ground portion of the PCB and the accommodation member, wherein the EMI absorber comprises an EMI conductive sheet having first and second portions, the first portion absorbing EMI from the ground portion of the PCB and the second portion for conducting EMI to the accommodation member, and an elastic member covered by the first portion.

The accommodation member can be conductive.

According to an exemplary embodiment of the present invention, an electronic device comprises an EMI-absorption target generating EMI, an EMI-discharge target grounding the EMI generated by the EMI-absorption target, and an EMI absorber configured to ground the EMI-absorption target to the EMI-discharge target, wherein the EMI absorber comprises an EMI conductive sheet having first and second portions, the first portion absorbing EMI from the EMI absorption target and the second portion for conducting EMI to the EMI discharge target and an elastic member covered by the first portion.

BRIEF DESCRIPTION OF THE DRAWINGS

Exemplary embodiments can be understood in more detail from the following description taken in conjunction with the accompanying drawings, in which.

DESCRIPTION OF EXEMPLARY
EMBODIMENTS

Exemplary embodiments of the present invention will be understood below in more detail with reference to the accompanying drawings. The present invention may be embodied in many different forms and should not be construed as limited to the embodiments set forth herein.

Figure 1:
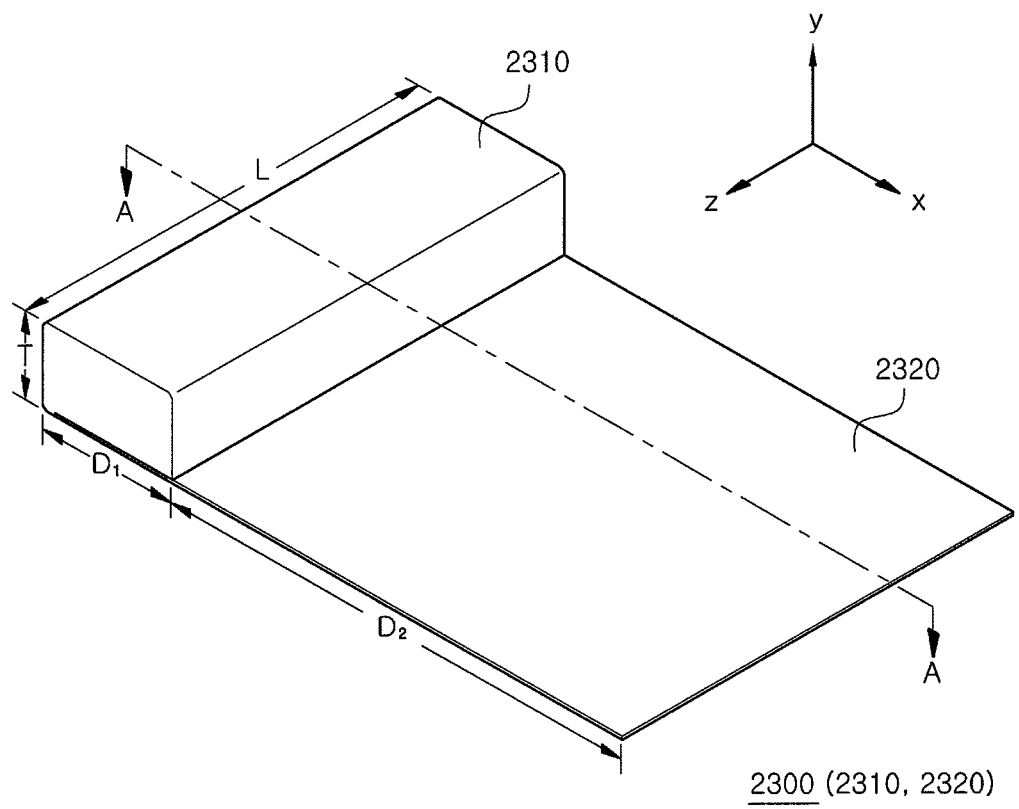
FIG. 1 is a schematic perspective view illustrating an electromagnetic interference (EMI) absorber in accordance with an exemplary embodiment of the present invention.
Figure 2:
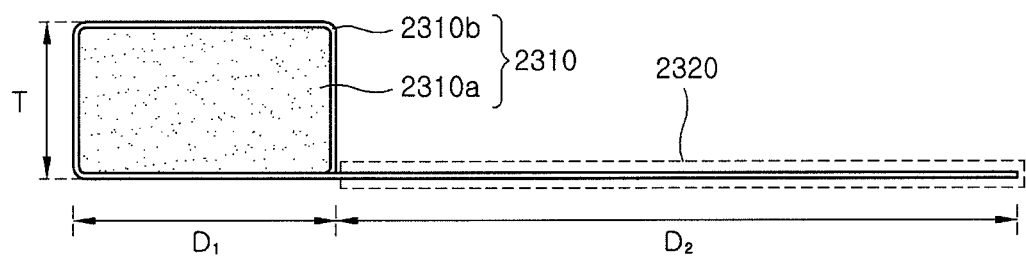
FIG. 2 is a cross-sectional view taken along the line A-A of FIG. 1.

FIG. 1 is a schematic perspective view illustrating an electromagnetic interference (EMI) absorber 2300 in accordance with an exemplary embodiment of the present invention. FIG. 2 is a sectional view taken along the line A-A of FIG. 1.

Referring to FIGS. 1 and 2, the EMI absorber 2300 includes an EMI absorption part 2310 and an EMI transmission part. The EMI absorption part 2310 includes an elastic member 2310a and a conductive cover 2310b. The EMI transmission part includes a conductive sheet 2320.

The elastic member 2310a functions as a cushion for the EMI absorption part 2310. The elastic member 2310a may include a nonconductive elastomer material. Examples of the nonconductive elastomer material may include a foamed polyurethane sponge, a foamed silicon sponge, a foamed neoprene sponge, a thermo plastic elastomer sponge, and a rubber sponge. The elastic member 2310a can have a block shape having a predetermined length and cross section. The predetermined cross section of the elastic member 2310a is a cross section parallel to the x-y plane and perpendicular to the z-axis (i.e., the length direction of the EMI absorption part 2310). The cross section of the elastic member 2310a can be circular, semicircular, elliptic, semi-elliptic, or polygonal. In an exemplary embodiment, the elastic member 2310a can have a pillar shape having a rectangular cross section. Although a foamed polyurethane sponge, a foamed silicon sponge, a foamed neoprene sponge, a thermo plastic elastomer sponge, and a rubber sponge are listed as examples of the nonconductive elastomer material included in the elastic member 2310a, other elastic materials functioning as a cushion can be used for the elastic member 2310a.

The conductive cover 2310b absorbs EMI and encloses the elastic member 2310a. The conductive cover 2310b is flexible so that the conductive cover 2310b can be formed around the elastic member 2310a. The conductive cover 2310b is conductive for absorbing EMI. For example, the conductive cover 2310b can be formed by plating a conductive material such as copper (Cu), copper/nickel (Cu/Ni), or silver (Ag) on a flexible polyester or nylon fabric using an electroless plating method. In an exemplary embodiment, a polyester fabric can be made by weaving, and a copper (Cu) layer is formed on the polyester fabric. A nickel/gold (Ni/Au) layer is formed on the copper (Cu) layer to form the conductive cover 2310b. The polyester fabric can be made using various weaving methods for obtaining a desired strength. For example, an adhesive (not shown) such as a hot-melt adhesive may be used between the elastic member 2310a and the conductive cover 2310b for a secured bonding thereof.

In an exemplary embodiment, the thickness (T) of the EMI absorption part 2310 can be varied according to the distance between an EMI-absorption target (an EMI-generating object) and an EMI-discharge target used as a ground object for absorbing EMI generated by the EMI-absorption target. When the EMI-absorption target is spaced apart from the EMI-discharge target by a predetermined distance, the EMI-absorption part 2310 of the EMI absorber can be disposed between the EMI-discharge target and a ground portion of the EMI-absorption target, and the conductive sheet 2320 can be bonded to the EMI-discharge target. In an exemplary embodiment, the thickness (T) of the EMI absorption part 2310 can be slightly larger than the distance between the EMI-absorption target and the EMI-discharge target for tightly fitting the EMI absorption part 2310 between the EMI-absorption target and the EMI-discharge target.

The length (L) of the EMI absorption part 2310 can be varied according to the area of the ground portion of the EMI-absorption target. For example, when the EMI absorber is fabricated, the length (L) of the EMI absorption part 2310 can be larger than the length of the ground portion of the EMI-absorption target. Then, the length of the EMI absorption part 2310 can be adjusted by cutting the EMI absorption part 2310. The width $D_1$ of the EMI absorption part 2310 can be varied according to the area of the ground portion of the EMI-absorption target.

The conductive sheet 2320 transmits EMI absorbed through the EMI absorption part 2310. The conductive sheet 2320 can have a sheet shape and connected to the conductive cover 2310b. The conductive sheet 2320 can comprise the same material used for forming the conductive cover 2310b. In an exemplary embodiment, the EMI absorption part 2310 can be formed integrally with the conductive cover 2310b and extend from the conductive cover 2310b in the x-axis direction intersecting the z-axis direction (the length direction of the elastic member 2310a). In an exemplary embodiment, although the conductive sheet 2320 and the conductive cover 2310b comprise the same material, the conductive sheet 2320 and the conductive cover 2310b can be prepared, for example, as separate parts and then bonded together.

The conductive cover 2310b can comprise a conductive and ductile sheet. For example, the conductive cover 2310b can comprise a conductive metal foil such as an aluminum (Al) foil. The conductive cover 2310b may enclose the entire surface of the elastic member 2310a. In an exemplary embodiment, the conductive cover 2310b may cover the elastic member 2310a in the length direction of the elastic member 2310a. The width $D_2$ of the conductive sheet 2320 (i.e., the EMI transmission part) can be varied according to a distance between an EMI-absorption target generating EMI and an EMI-discharge target used as the ground.

An EMI absorber in an exemplary embodiment includes the elastic member 2310a, the conductive cover 2310b enclosing the elastic member 2310a, and the conductive sheet 2320 extended from the conductive cover 2310b. The conductive cover 2310b and the conductive sheet 2320 can comprise the same material and be formed through the same process. Alternatively, the conductive cover 2310b and the conductive sheet 2320 can comprise different materials. When the conductive cover 2310b and the conductive sheet 2320 comprise different materials, the conductive sheet 2320 may be attached to the conductive cover 2310b.

The EMI absorber in an exemplary embodiment may further include an adhesive to be attached to the EMI-absorption target. For example, an adhesive can be applied to a surface of the conductive sheet 2320 and a surface of the conductive cover 2310b which are in the same plane to attach the EMI absorber to an EMI-absorption target. After the adhesive is applied to the conductive sheet 2320 and the conductive cover 2310b, a protective film can be placed on the adhesive for protecting the adhesive from foreign substances.

The conductive cover 2310b enclosing the elastic member 2310a absorbs EMI generated from an EMI-absorption target. Then, the absorbed EMI is transmitted to an EMI-discharge target bonded to the conductive sheet 2320. The EMI absorber 2300 includes the EMI absorption part 2310 and the EMI transmission part. Therefore, although an EMI-absorption target is formed distant from an EMI-discharge target, the EMI absorber 2300 can be connected between the EMI-absorption target and the EMI-discharge target for grounding the EMI-absorption target to the EMI-discharge target. The EMI absorption part 2310 and the EMI transmission part can be formed in one piece.

Figure 3:
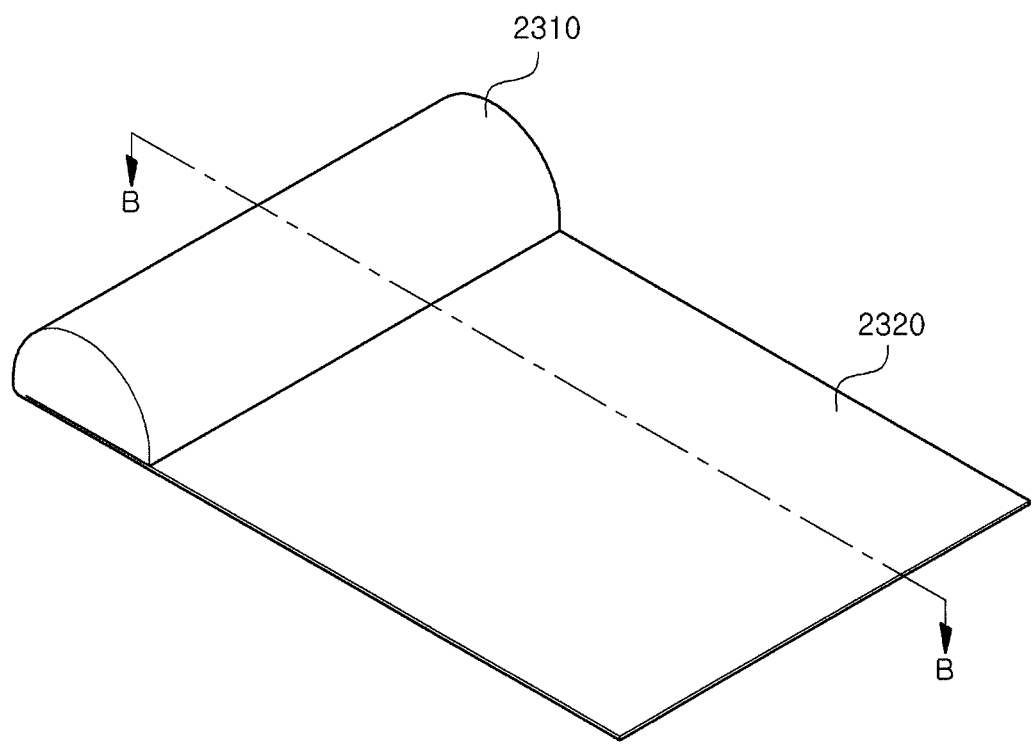
FIG. 3 is a schematic perspective view illustrating an EMI absorber in accordance with an exemplary embodiment of the present invention.
Figure 4:
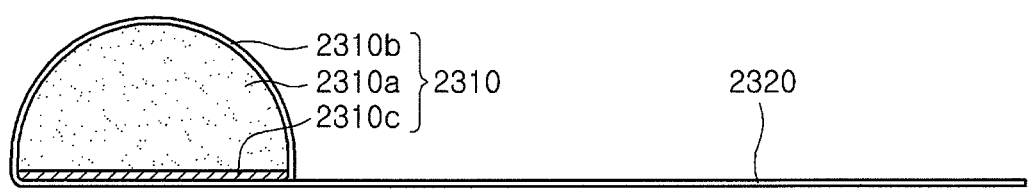
FIG. 4 is a cross-sectional view taken along the line B-B of FIG. 3.

FIG. 3 is a schematic perspective view illustrating an EMI absorber in accordance with an exemplary embodiment of the present invention. FIG. 4 is a cross-sectional view taken along the line B-B of FIG. 3. FIGS. 5A through 5D are cross-sectional views illustrating EMI absorbers in accordance with exemplary embodiments of the present invention.

Referring to FIGS. 3 and 4, the EMI absorber includes an EMI absorption part 2310 and an EMI transmission part. The EMI absorption part 2310 includes an elastic member 2310a, a conductive cover 2310b, and a support 2310c. The EMI transmission part includes a conductive sheet 2320. The EMI absorber can further include an adhesive member (not shown) and a protective film (not shown) protecting the adhesive member from foreign substances. The adhesive member can be attached to a surface of the conductive sheet 2320 and a surface of the conductive cover 2310b placed in the same plane. The adhesive member can include a conductive adhesive tape such as a double-sided conductive adhesive tape.

The elastic member 2310a can include a nonconductive elastomer material. Examples of the nonconductive elastomer material include a foamed polyurethane sponge, a foamed silicon sponge, a foamed neoprene sponge, a thermo plastic elastomer sponge, and a rubber sponge. The elastic member 2310a can have a semicircular, a semi-elliptic, or a polygonal cross section. In an exemplary embodiment with reference to FIGS. 3 and 4, the elastic member 2310a has a semicircular cross section.

Figure 5A:
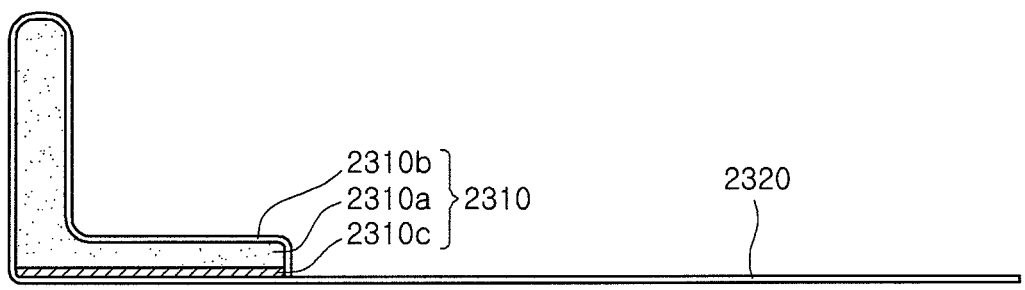
FIGS. 5A through 5D are cross-sectional views illustrating EMI absorbers in accordance with exemplary embodiments of the present invention.
Figure 5B:
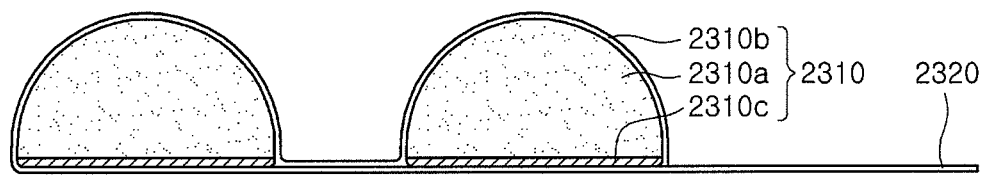
Figure 5C:
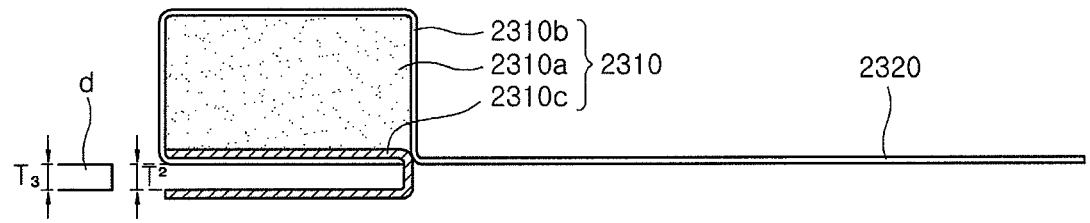

When the EMI absorber is attached to an EMI-absorption target, the support 2310c prevents the EMI absorber from being pleated or deformed by an external force. The support 2310c can have a flat sheet shape and be disposed between the elastic member 2310a and the conductive cover 2310b. The elastic member 2310a, the conductive sheet 2320, and the support 2310c can be bonded together using an adhesive. The support 2310c may include a sheet such as a polyvinyl chloride (PVC) sheet, a polyethylene sheet, or a polyester sheet. The shape of the support 2310c can be varied. For example, referring to FIG. 5A, when an L-shaped EMI absorption part 2310 is provided, a support 2310c having a shape corresponding to the L-shaped EMI absorption part 2310 can be provided. Referring to FIG. 5B, when two semicircular EMI absorption parts 2310 are provided, two corresponding supports 2310c can be provided. Referring to FIG. 5C, a support 2310c has a clip shape or a fastener shape having an extension for coupling with a hook portion. The support 2310c can be coupled to an EMI-absorption target such as a printed circuit board (PCB).

Figure 5D:
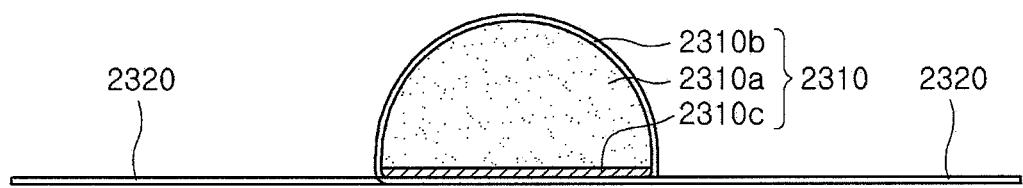

When the support 2310c has a fastener shape, an EMI-absorption target such as a PCB may have a hook hole for coupling with the support 2310c. When the support 2310c has a clip shape, the support 2310c may have a gap thickness $T_2$ equal to or smaller than a thickness $T_3$ of an EMI-absorption target (d). Referring to FIG. 5D, an EMI absorption part 2310 and two EMI transmission parts are provided. That is, the EMI absorber of the exemplary embodiment can include one or more EMI absorption parts 2310 and one or more EMI transmission parts, and the numbers of the EMI absorption parts 2310 and the EMI transmission parts can be varied.

In an exemplary embodiment, the elastic member 2310a and the conductive cover 2310b are boned together using an adhesive. In another exemplary embodiment, only the support 2310c can be bonded to the elastic member 2310a and the conductive cover 2310b such that the elastic member 2310a, the support 2310c, and the conductive cover 2310b can be prevented from being floated. In this case, since the elastic member 2310a and the conductive cover 2310b are not directly bonded to each other, a contact between the EMI absorption part 2310 and an EMI-absorption target can be maintained by the restoring force of the conductive cover 2310b even when the elastic member 2310a is deformed by an external force. Thus, the conductive cover 2310b can be conductive, flexible, and elastic. For example, the conductive cover 2310b can comprise a conductive fabric.

When fabricating an EMI absorber having an EMI absorption part with a cross section of a semicircular or a semi-elliptical shape, an elastic member 2310a is prepared into a semicircular or a semi-elliptical shape by, for example, molding or extrusion. In such a case, a material having a density higher than a specific value is used for forming the semicircular or a semi-elliptical elastic member by the molding or extrusion. When a low-density elastic member is used, only a rectangular EMI absorption part can be formed.

In an EMI absorber according to an exemplary embodiment of the present invention, the support 2310c assists forming the EMI absorption part 2310 into a semicircular or a semi-elliptical shape. That is, for example, when the EMI absorber is fabricated, the cross-section of the elastic member 2310a can be transformed from a rectangular shape to a semicircular shape or a semi-elliptical shape by pulling the conductive cover 2310b enclosing the elastic member 2310a in a direction perpendicular to the length of the conductive cover 2310b and then fixing both sides of the conductive cover 2310b.

In an exemplary embodiment, since the support 2310c supports one surface of the elastic member 2310a, the surface of the elastic member 2310a can be kept flat. Then, both sides of the conductive cover 2310b are fixed to maintain the semicircular or the semi-elliptical shape of the elastic member 2310a. In an exemplary embodiment, the EMI absorption part 2310 of the EMI absorber can be formed into various shapes without an additional process owing to the support 2310c.

When the EMI absorption part 2310 of the EMI absorber is disposed between the EMI-absorption target and the EMI-discharge target, the EMI absorption part 2310 can be tightly fitted between the EMI-absorption target and the EMI-discharge target when the EMI absorption part 2310 is pushed by a small force since a contact area between the EMI absorption part 2310, and the EMI-absorption target is small due to the semicircular shape of the EMI absorption part 2310. The contact area between the EMI absorption part 2310 and the EMI-absorption target is gradually increased along with an external force. Therefore, a uniform compression force can be transmitted, and a local short circuit between the EMI absorption part 2310 and the EMI-absorption target can be prevented.

Figure 6:
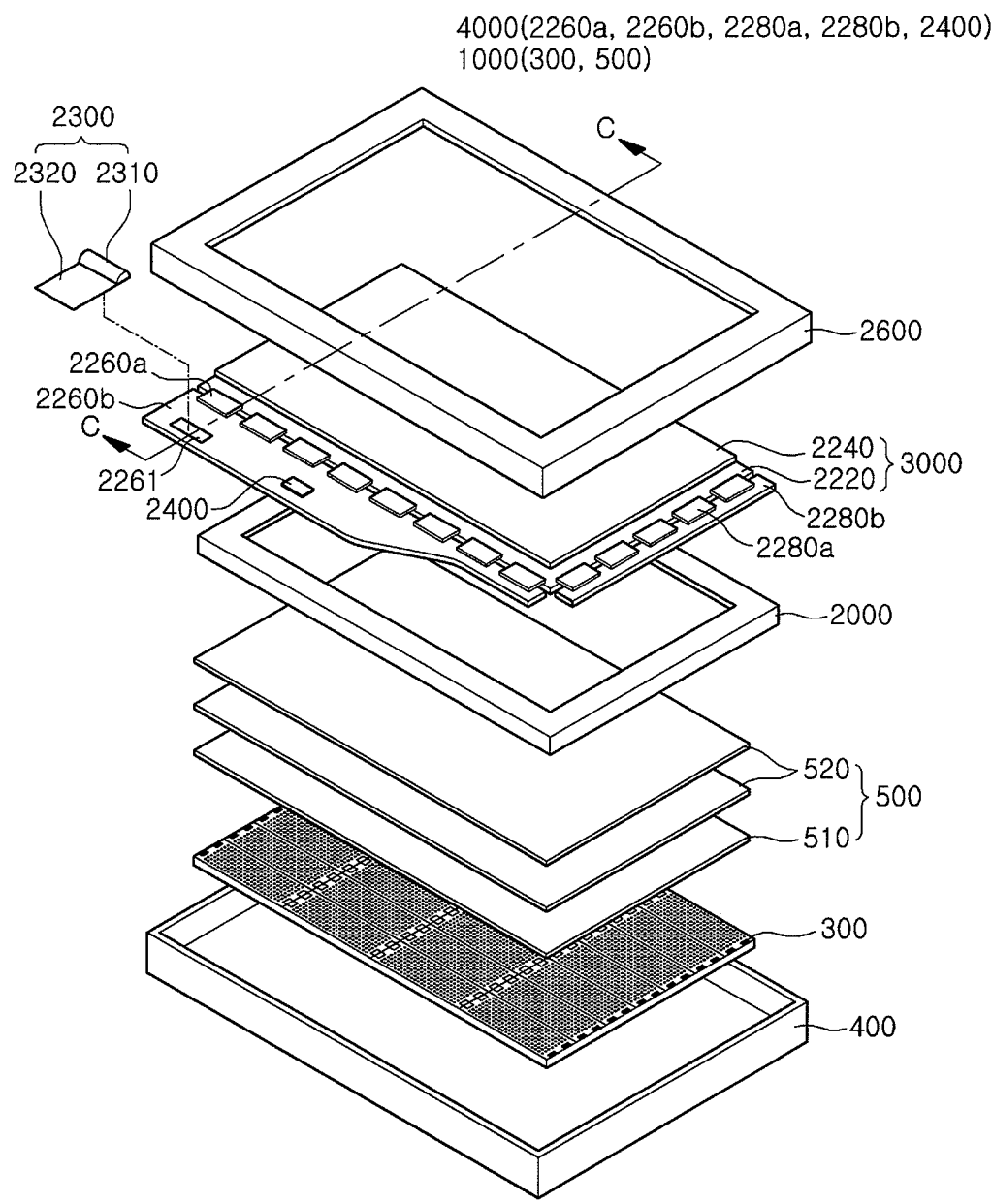
FIG. 6 is a schematic exploded perspective view illustrating a liquid crystal display (LCD) device in accordance with an exemplary embodiment of the present invention.
Figure 7:
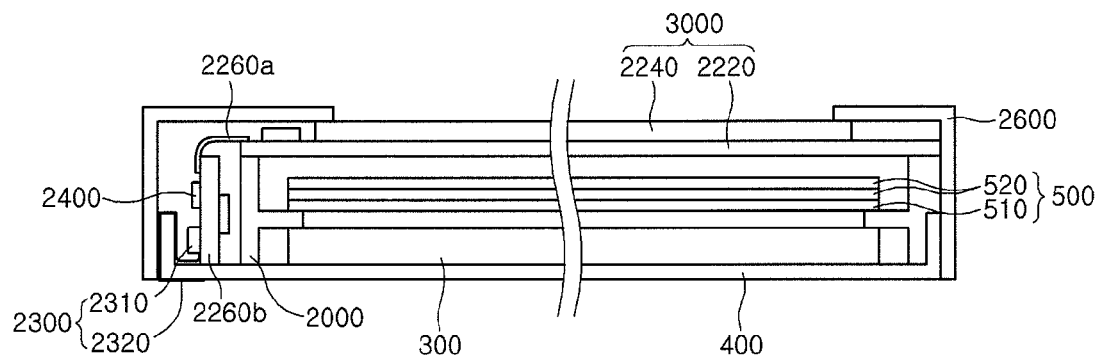
FIG. 7 is a cross-sectional view taken along the line C-C of FIG. 6.
Figure 8A:
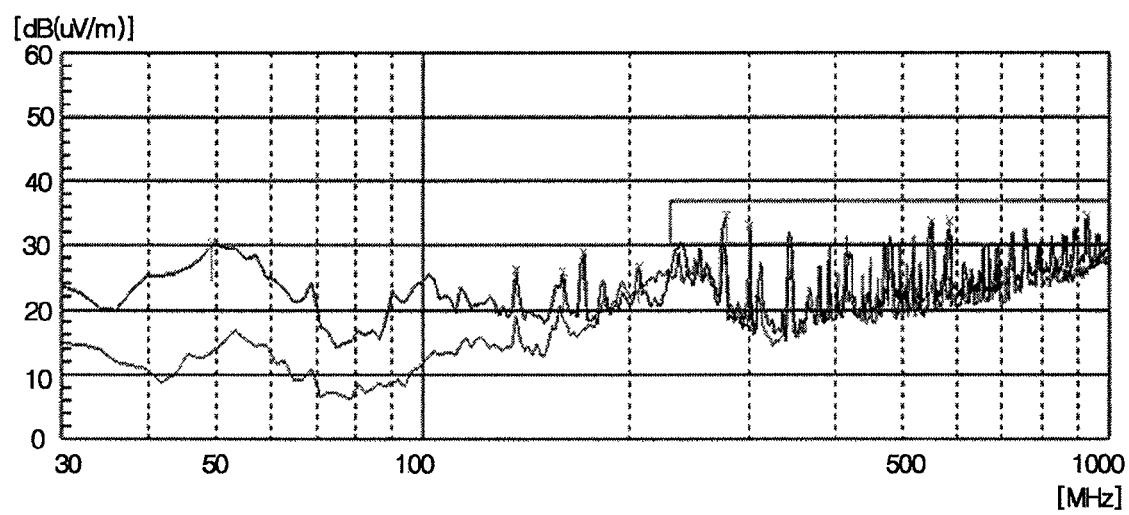
FIG. 8A is a noise graph of an LCD device including an EMI absorber in a conventional art.
Figure 8B:
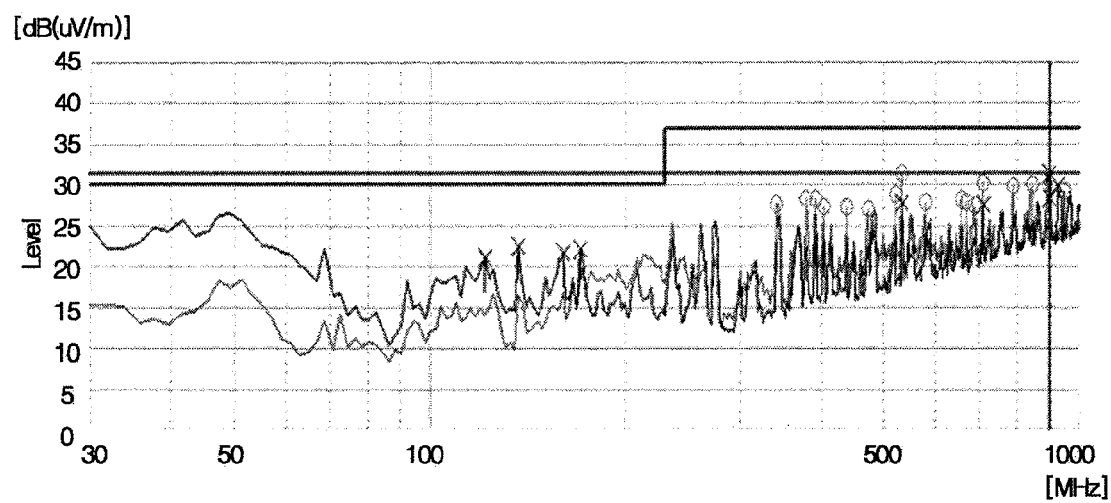
FIG. 8B is a noise graph of an LCD device including an EMI absorber in an exemplary embodiment of the present invention.

FIG. 6 is a schematic exploded perspective view illustrating an LCD device in accordance with an exemplary embodiment of the present invention. FIG. 7 is a sectional view taken along the line C-C of FIG. 6. FIG. 8A is a noise graph of an LCD device including an EMI absorber in a conventional art. FIG. 8B is a noise graph of an LCD device including an EMI absorber in an exemplary embodiment of the present invention.

Referring to FIGS. 6 and 7, the LCD device includes an LCD panel assembly and a backlight unit assembly. The LCD panel assembly includes an LCD panel 3000 and an LCD panel driving unit 4000 for driving the LCD panel 3000. The backlight assembly includes a backlight unit 1000 supplying light to the LCD panel 3000, and a backlight unit driver (not shown) for driving the backlight unit 1000. The LCD device further includes an upper accommodation member 2600 where the LCD panel assembly is disposed, a lower accommodation member 400 where the backlight unit assembly is disposed, and an EMI absorber 2300 transmitting EMI generated from the LCD panel driving unit 4000 to the upper accommodation member 2600 or the lower accommodation member 400. The upper and lower accommodation members 2600 and 400 are used as an electrical ground. Thus, the upper and lower accommodation members 2600 and 400 may comprise a conductive material such as a metal.

The LCD panel assembly includes the LCD panel 3000 and the LCD panel driving unit 4000 for driving the LCD panel 3000. The LCD panel 3000 includes a thin film transistor substrate 2220, a color filter substrate 2240 corresponding to the thin film transistor substrate 2220, and a liquid crystal layer (not shown) injected between the thin film transistor substrate 2220 and the color filter substrate 2240. The LCD panel 3000 includes polarizers (not shown) disposed to correspond to an upper side of the color filter substrate 2240 and a lower side of the thin film transistor substrate 2220.

The LCD panel driving unit 4000 drives the LCD panel 3000. The LCD panel driving unit 4000 may include a data-side tape carrier package (TCP) 2260a connected to the thin film transistor substrate 2220, a gate-side TCP 2280a connected to the thin film transistor substrate 2220, a data-side PCB 2260b connected to the data-side TCP 2260a, gate-side PCB 2280b connected to the gate-side TCP 2280a, and a field-programmable gate array (FPGA). The FPGA (not shown) receives an output image signal of a graphic controller (not shown) receiving an image signal from an external video card, and outputs the received image signal to the LCD panel 3000. The data-side PCB 2260b includes a ground portion 2261 having a predetermined size. The EMI absorber 2300 is attached to the ground portion 2261.

The EMI absorber 2300 includes an EMI absorption part 2310 and an EMI transmission part. The EMI absorption part 2310 includes an elastic member 2310a and a conductive cover 2310b. The EMI transmission part includes a conductive sheet 2320. The EMI absorber 2300 can further include a support 2310c between the elastic member 2310a and the conductive cover 2310b. In an exemplary embodiment, the EMI absorber 2300 includes the support 2310c and the EMI absorption part 2310 having a rectangular cross-sectional shape.

In an LCD device of an exemplary embodiment including the EMI absorber 2300, the EMI absorption part 2310 is attached to the ground portion 2261 of the data-side PCB 2260b, and the conductive sheet 2320 may be attached to an outer surface of the lower accommodation member 400.

Since the EMI absorber 2300 is attached to two ground portions (i.e., one is the ground portion 2261 of the data-side PCB 2260b, and the other is the lower accommodation member 400) in an exemplary embodiment, EMI generated from the LCD panel driving unit 4000 can be reduced as shown in FIGS. 8A and 8B.

FIG. 8A is a noise graph of an LCD device including an EMI absorber of a conventional art. FIG. 8B is a noise graph of an LCD device including an EMI absorber in accordance with an exemplary embodiment of the present invention. In FIG. 8A, a block type EMI absorber is attached only to a ground portion of a data-side PCB. In FIG. 8B, an EMI absorption part of the EMI absorber is attached to a ground portion of a data-side PCB, and an EMI transmission part extending from the EMI absorption part is attached to a lower accommodation member according to an exemplary embodiment of the present invention.

Referring to FIGS. 8A and 8B, in a frequency band between about 68 MHz and about 300 MHz, EMI noise of the LCD device of the exemplary embodiment is lower than that of the conventional LCD device by about 8 db or more. In other words, in the frequency band between about 68 MHz and about 300 MHz, the LCD device of an exemplary embodiment can have a noise margin greater than that of the conventional LCD device by about 8 db or more. Due to the increase of the noise margin, the number of layers of a PCB such as the data-side PCB 2260b can be reduced. Even though EMI increases as the area of a ground portion of the PCB decreases, the size of the PCB can be reduced as much as the increased noise margin. Since the EMI absorber of an exemplary embodiment includes the EMI absorption part 2310 and the conductive sheet 2320, the EMI absorber can reduce the EMI as compared with the case where only the conductive sheet 2320 is connected to the ground portion 2261 of the data-side PCB 2260b and the lower accommodation member 400.

In an exemplary embodiment, the backlight unit assembly supplies light to the LCD panel 3000. The backlight unit assembly includes a backlight unit 1000 and a backlight unit driver (not shown). The backlight unit 1000 includes a light emitting diode (LED) assembly 300 provided with LEDs, and optical sheets 500 for improving the quality of light emitted from the LEDs of the LED assembly 300. The backlight unit driver (not shown) drives the LEDs of the LED assembly 300. The LCD device can further include a mold frame 2000 for fixing the LED assembly 300 and the optical sheets 500. In an exemplary embodiment, the LEDs of the LED assembly 300 are disposed on a substrate.

An LCD device where a gap exists between upper and lower accommodation members is described with reference to FIGS. 9 and 10.

Figure 9:
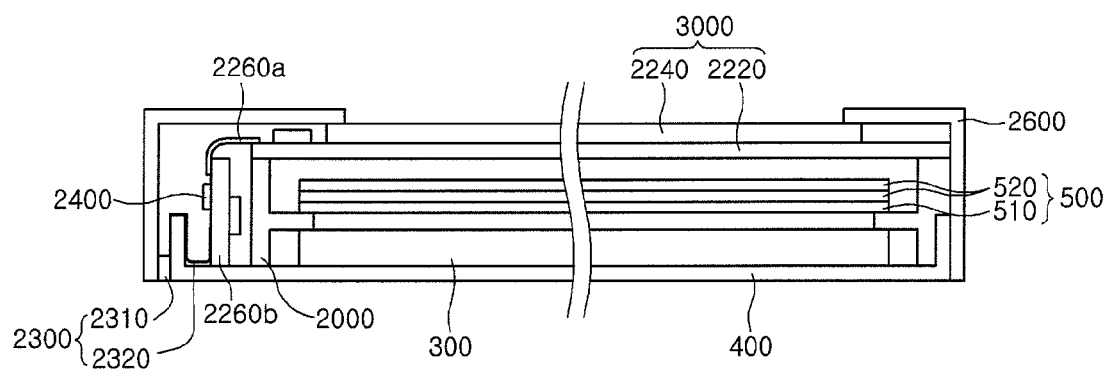
FIGS. 9 and 10 are schematic cross-sectional views illustrating LCD devices in accordance with exemplary embodiments of the present invention.
Figure 10:
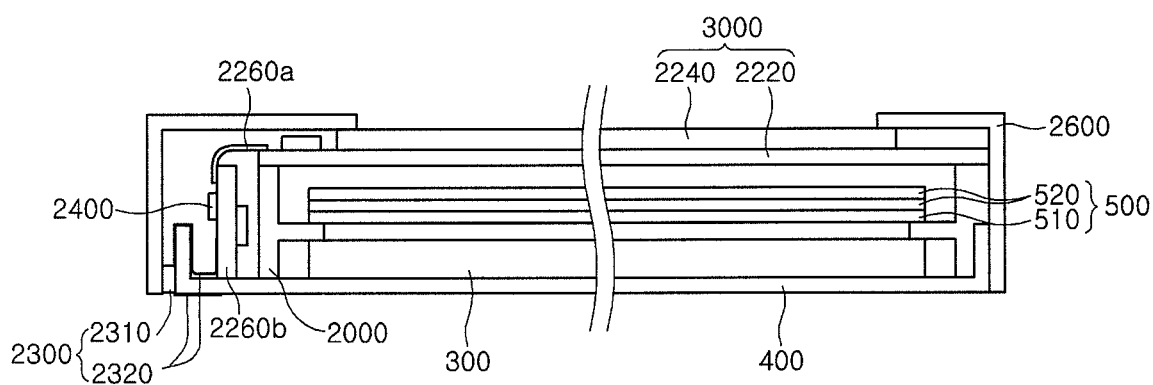

FIGS. 9 and 10 are schematic cross-sectional views illustrating LCD devices in accordance with exemplary embodiments of the present invention.

Referring to FIG. 9, the LCD device in an exemplary embodiment includes an LCD panel assembly and a backlight unit assembly. The LCD panel assembly includes an LCD panel 3000 and an LCD panel driving unit 4000 for driving the LCD panel 3000. The backlight unit assembly includes a backlight unit 1000 supplying light to the LCD panel 3000, and a backlight unit driver (not shown) for driving the backlight unit 1000. The LCD device can further include an upper accommodation member 2600 where the LCD panel assembly is disposed, and a lower accommodation member 400 where the backlight unit assembly is disposed. The LCD device includes an EMI absorber 2300 transmitting EMI generated from the LCD panel driving unit 4000 to the upper accommodation member 2600 or the lower accommodation member 400. After the upper and lower accommodation members 2600 and 400 are assembled, a gap exists between the upper and lower accommodation members 2600 and 400.

The EMI absorber 2300 includes an EMI absorption part 2310 and an EMI transmission part. The EMI absorption part 2310 includes an elastic member 2310*a* and a conductive cover 2310*b*. The EMI transmission part includes a conductive sheet 2320. The EMI absorber 2300 can further include a support 2310*c* between the elastic member 2310*a* and the conductive cover 2310*b*. In an exemplary embodiment, the EMI absorber 2300 includes the support 2310*c*, and the cross-sectional shape of the EMI absorption part 2310 is semicircular.

In the LCD device of an exemplary embodiment, the EMI transmission part can be attached to a ground portion (not shown) of a data-side PCB 2260*b*, and the EMI absorption part 2310 can be disposed between the gap between the upper and lower accommodation members 2600 and 400. Although a gap exists between the upper and lower accommodation members 2600 and 400, the EMI absorption part 2310 can be fitted in the gap between the upper and lower accommodation members 2600 and 400 since the elastic member 2310*a* has a predetermined thickness. Since the EMI absorption part 2310 fills the gap between the upper and lower accommodation members 2600 and 400, the upper accommodation member 2600 as well as the lower accommodation member 400 can be used as an electric ground.

The EMI transmission part is attached to the data-side PCB 2260*b*, and the EMI absorption part 2310 is disposed between the upper and lower accommodation members 2600 and 400. In accordance with an exemplary embodiment shown in FIG. 10, an EMI absorber 2300 includes an EMI absorption part 2310 and two EMI transmission parts. One of the EMI transmission parts can be attached to a data-side PCB 2260*b*, and the EMI absorption part 2310 can be disposed between upper and lower accommodation members 2600 and 400. The other EMI transmission part can be attached to the lower accommodation member 400. In this case, a contact area between the EMI absorber 2300 and the lower accommodation member 400 can be increased.

Exemplary embodiments provide an EMI absorber reducing the EMI although the area of an electrical ground is small; a display device including the EMI absorber; and an electronic device including the EMI absorber.

Exemplary embodiments of the present invention provide an EMI absorber transmitting EMI from a ground portion of an EMI-absorption target to an EMI-discharge target when the EMI-absorption target is distant from the EMI-discharge target; a display device including the EMI absorber; and an electronic device including the EMI absorber.

Exemplary embodiments provide an EMI absorber including an EMI absorption part and a conductive sheet formed in one piece; a display device including the EMI absorber; and a electronic device including the EMI absorber.

According to exemplary embodiments of the present invention, the EMI absorber of the exemplary embodiment can also be used in various display devices and electronic devices. The EMI absorber can be used for any device including an EMI generating component such as a PCB. The EMI absorber can also be used for any electronic device including an EMI-absorption target (an EMI generating component) and an EMI-discharge target used as an electrical ground for the EMI-absorption target. The EMI absorber according to exemplary embodiments of the present invention can ground the EMI-absorption target to the EMI-discharge target.

Although exemplary embodiments have been described with reference to the accompanying drawings, it is to be understood that the present invention is not limited to these precise embodiments, but various changes and modifications can be made by one skilled in the art without departing from the spirit and scope of the present invention. All such changes and modifications are intended to be included within thescope of the invention as defined by the appended claims.

What is claimed is:

1. An electromagnetic interference (EMI) absorber comprising:
 an EMI conductive sheet having first and second portions, the first portion absorbing EMI from an EMI absorption target and the second portion for conducting EMI to an EMI discharge target;
 an elastic member covered by the first portion, wherein the first portion is flexible and maintains its flexibility after the EMI absorber is formed; and
 a support disposed between the elastic member and the first portion, wherein the first portion covers an upper surface and side surfaces of the elastic member and a lower surface of the support,
 wherein the support is bonded to the first portion and the elastic member and wherein the elastic member and the first portion are not directly bonded to each other, and wherein the flexible first portion is configured to have a restoring force so that a contact between the EMI conductive sheet and the EMI absorption target is capable of being maintained by the restoring force of the first portion if the elastic member is deformed by an external force, wherein all parts of the support are disposed only between the elastic member and the first portion, and wherein all parts of the elastic member and the all of the parts of the support completely overlap with each other.

2. The EMI absorber of claim 1, wherein the first portion and the second portion are formed from a single sheet.

3. The EMI absorber of claim 1, wherein the first portion and the second portion are formed from separate sheets and electrically coupled with each other.

4. The EMI absorber of claim 1, wherein the EMI absorption target comprises a ground portion of a data-side PCB and the EMI discharge target comprises an outer surface of a lower accommodation member of an LCD device, and wherein the first portion of the EMI conductive sheet is attached to the ground portion of the data-side PCB and the second portion of the EMI conductive sheet is attached to the outer surface of the lower accommodation member which includes a backlight unit assembly disposed therein.

5. The EMI absorber of claim 1, wherein the elastic member and the first portion of the EMI sheet forms a volume and the second portion extends axially from a bottom portion of the volume.

6. The EMI absorber of claim 5, wherein the elastic member has at least one of a circular shape, an elliptical shape or a polygonal shape.

7. The EMI absorber of claim 1, wherein the elastic member comprises a sponge.

8. The EMI absorber of claim 7, wherein the sponge is selected from a group consisting of at least one of a foamed polyurethane, a foamed silicon, a foamed neoprene, a thermo plastic elastomer, a rubber or any combinations thereof.

9. The EMI absorber of claim 1, wherein the conductive sheet comprises a fabric and a metal plated on the fabric.

10. The EMI absorber of claim 9, wherein the fabric comprises at least one of polyester or nylon.

11. The EMI absorber of claim 9, wherein the metal comprises at least one of copper (Cu), silver (Ag), or copper (Cu)/nickel (Ni).

12. The EMI absorber of claim 1, wherein the conductive sheet comprises a conductive foil.

13. The EMI absorber of claim 1, wherein the support comprises at least one of polyvinyl chloride (PVC) or polyethylene.

14. The EMI absorber of claim 1, wherein the support has a width equal to or smaller than that of the elastic member.

15. The EMI absorber of claim 1, wherein the support has at least one of a sheet shape, a fastener shape, or a clip shape.

16. The EMI absorber of claim 1, wherein the EMI absorber includes one or more elastic members.

17. The EMI absorber of claim 1, further comprising a conductive adhesive member disposed on a surface of the conductive sheet.

18. The EMI absorber of claim 1, wherein the EMI absorption target comprises an upper accommodating member including an LCD panel assembly disposed therein and a lower accommodating member including a backlight unit assembly disposed therein, and wherein the EMI discharge target comprises a ground portion of a data-side PCB, wherein the first portion of the EMI conductive sheet fills a gap between the upper accommodating member and the lower accommodating member such that the first portion of the EMI conductive sheet is in direct physical contact with the upper accommodating member and the lower accommodating member in the gap and wherein the second portion of the EMI conductive sheet is attached to the ground portion of the data-side PCB.

19. The EMI absorber of claim 18, wherein the EMI conductive sheet further comprises an additional second portion, and wherein the additional second portion is attached to an outer surface of the lower accommodation member which includes the backlight unit assembly disposed therein.

20. The EMI absorber of claim 1, wherein the elastic member is a nonconductive elastomer material.

21. A display device comprising:
a display panel;
a printed circuit board (PCB) for driving the display panel, the PCB comprising a ground portion;
an accommodation member for receiving the display panel and the PCB; and
an EMI absorber connecting the ground portion of the PCB and the accommodation member, wherein the EMI absorber comprises:
an EMI conductive sheet having first and second portions, the first portion absorbing EMI from the ground portion of the PCB and the second portion for conducting EMI to the accommodation member;
an elastic member covered by the first portion, wherein the first portion is flexible and maintains its flexibility after the EMI absorber is formed; and
a support disposed between the elastic member and the first portion, wherein the first portion covers an upper surface and side surfaces of the elastic member and a lower surface of the support,
wherein the support is bonded to the first portion and the elastic member and wherein the elastic member and the first portion are not directly bonded to each other, and wherein the flexible first portion is configured to have a restoring force so that a contact between the EMI conductive sheet and the ground portion is capable of being maintained by the restoring force of the first portion if the elastic member is deformed by an external force, wherein all parts of the support are disposed only between the elastic member and the first portion, and wherein all parts of the elastic member and the all of the parts of the support completely overlap with each other.

22. The display device of claim 21, wherein the accommodation member is conductive.

23. The display device of claim 21, wherein the elastic member is a nonconductive elastomer material.

24. An electronic device comprising:
an EMI-absorption target generating EMI;
an EMI-discharge target grounding the EMI generated by the EMI-absorption target; and
an EMI absorber configured to ground the EMI-absorption target to the EMI-discharge target, wherein the EMI absorber comprises:
an EMI conductive sheet having first and second portions, the first portion absorbing EMI from the EMI absorption target and the second portion for conducting EMI to the EMI discharge target;
an elastic member covered by the first portion, wherein the first portion is flexible and maintains its flexibility after the EMI absorber is formed; and
a support disposed between the elastic member and the first portion, wherein the first portion covers an upper surface and side surfaces of the elastic member and a lower surface of the support,
wherein the support is bonded to the first portion and the elastic member and wherein the elastic member and the first portion are not directly bonded to each other, wherein the flexible first portion is configured to have a restoring force so that a contact between the EMI conductive sheet and the EMI absorption target is capable of being maintained by the restoring force of the first portion if the elastic member is deformed by an external force, wherein all parts of the support are disposed only between the elastic member and the first portion, and wherein all parts of the elastic member and the all of the parts of the support completely overlap with each other.

25. The electronic device of claim 24, wherein the elastic member is a nonconductive elastomer material.

\* \* \* \* \*